(12) United States Patent
Mughal et al.

(10) Patent No.: US 11,411,137 B2
(45) Date of Patent: Aug. 9, 2022

(54) III-NITRIDE LIGHT EMITTING DIODES WITH TUNNEL JUNCTIONS WAFER BONDED TO A CONDUCTIVE OXIDE AND HAVING OPTICALLY PUMPED LAYERS

(71) Applicant: The Regents of the University of California, Oakland, CA (US)

(72) Inventors: Asad J. Mughal, Goleta, CA (US); Stacy J. Kowsz, Goleta, CA (US); Robert M. Farrell, Goleta, CA (US); Benjamin P. Yonkee, Goleta, CA (US); Erin C. Young, Santa Barbara, CA (US); Christopher D. Pynn, Goleta, CA (US); Tal Margalith, Santa Barbara, CA (US); James S. Speck, Santa Barbara, CA (US); Shuji Nakamura, Santa Barbara, CA (US); Steven P. DenBaars, Goleta, CA (US)

(73) Assignee: THE REGENTS OF THE UNIVERSITY OF CALIFORNIA, Oakland, CA (US)

(*) Notice: Subject to any disclaimer, the term of this patent is extended or adjusted under 35 U.S.C. 154(b) by 552 days.

(21) Appl. No.: 16/075,949

(22) PCT Filed: Feb. 6, 2017

(86) PCT No.: PCT/US2017/016720
§ 371 (c)(1),
(2) Date: Aug. 6, 2018

(87) PCT Pub. No.: WO2017/136832
PCT Pub. Date: Aug. 10, 2017

(65) Prior Publication Data
US 2020/0335663 A1 Oct. 22, 2020

Related U.S. Application Data

(60) Provisional application No. 62/298,268, filed on Feb. 22, 2016, provisional application No. 62/292,015, filed on Feb. 5, 2016.

(51) Int. Cl.
*H01L 33/32* (2010.01)
*H01L 33/00* (2010.01)
(Continued)

(52) U.S. Cl.
CPC .......... *H01L 33/32* (2013.01); *H01L 25/0756* (2013.01); *H01L 33/0093* (2020.05);
(Continued)

(58) Field of Classification Search
CPC ......... H01L 33/04; H01L 33/32; H01L 33/42; H01L 33/0093; H01L 33/06
See application file for complete search history.

(56) References Cited

U.S. PATENT DOCUMENTS 8,053,794 B2 * 11/2011 Lee .................... H01L 33/32
257/96
8,860,044 B2 * 10/2014 Yeh .................... H01L 33/32
257/88
(Continued)

FOREIGN PATENT DOCUMENTS

CN 100593248 C * 3/2010 ............. H01L 33/40
CN 103325913 9/2013
(Continued)

OTHER PUBLICATIONS

Tamboli et al., "III-V/Si Wafer Bonding Using Transparent, Conductive Oxide Interlayers", Jul. 2, 2015, Appl. Phys. Lett., 106, 263904. (Year: 2015).*
(Continued)

*Primary Examiner* — Joshua King
(74) *Attorney, Agent, or Firm* — Gates & Cooper LLP

(57) ABSTRACT

A III-nitride optoelectronic device includes at least one n-type layer, an active region grown on or above the n-type layer, at least one p-type layer grown on or above the active region, and a tunnel junction grown on or above the p-type
(Continued)

layer. A conductive oxide may be wafer bonded on or above the tunnel junction, wherein the conductive oxide comprises a transparent conductor and may contain light extraction features on its non-bonded face. The tunnel junction also enables monolithic incorporation of electrically-injected and optically-pumped III-nitride layers, wherein the optically-pumped III-nitride layers comprise high-indium-content III-nitride layers formed as quantum wells (QWs) that are grown on or above the tunnel junction. The optically-pumped high-indium-content III-nitride layers emit light at a longer wavelength than the electrically-injected III-nitride layers.

14 Claims, 5 Drawing Sheets

(51) Int. Cl.
    *H01L 25/075*    (2006.01)
    *H01L 33/06*    (2010.01)
    *H01L 33/42*    (2010.01)
    *H01L 33/04*    (2010.01)

(52) U.S. Cl.
    CPC .............. *H01L 33/06* (2013.01); *H01L 33/42* (2013.01); *H01L 33/04* (2013.01)

(56) References Cited

U.S. PATENT DOCUMENTS

| | | | | |
|---|---|---|---|---|
| 9,197,804 | B1* | 11/2015 | Or-Bach | H04N 5/2253 |
| 2003/0122147 | A1* | 7/2003 | Sheu | H01L 33/32 |
| | | | | 257/103 |
| 2003/0189212 | A1* | 10/2003 | Yoo | H01L 33/0093 |
| | | | | 257/79 |
| 2005/0173724 | A1* | 8/2005 | Liu | H01L 33/42 |
| | | | | 257/103 |
| 2005/0196887 | A1* | 9/2005 | Liu | H01L 33/14 |
| | | | | 438/22 |
| 2005/0208686 | A1* | 9/2005 | Ryu | H01L 33/007 |
| | | | | 438/21 |
| 2007/0001186 | A1* | 1/2007 | Murai | H01L 33/20 |
| | | | | 257/98 |
| 2007/0029541 | A1* | 2/2007 | Xin | H01L 33/04 |
| | | | | 257/14 |
| 2008/0073658 | A1* | 3/2008 | Wirth | H01L 33/145 |
| | | | | 257/96 |
| 2008/0135868 | A1* | 6/2008 | Okagawa | H01L 33/405 |
| | | | | 257/99 |
| 2008/0190479 | A1* | 8/2008 | Hsieh | H01L 31/0725 |
| | | | | 136/246 |
| 2008/0277682 | A1* | 11/2008 | Mishra | H01L 33/22 |
| | | | | 257/98 |
| 2009/0072262 | A1* | 3/2009 | Iza | H01L 33/04 |
| | | | | 257/98 |
| 2011/0101304 | A1* | 5/2011 | Song | H01L 33/04 |
| | | | | 257/13 |
| 2011/0101414 | A1* | 5/2011 | Thompson | H01L 33/32 |
| | | | | 257/103 |
| 2012/0205625 | A1* | 8/2012 | Iza | H01L 33/12 |
| | | | | 257/22 |
| 2013/0015465 | A1* | 1/2013 | Lee | H01L 33/40 |
| | | | | 257/76 |
| 2014/0353581 | A1 | 12/2014 | Strassburg et al. | |
| 2015/0115220 | A1* | 4/2015 | Iza | H01L 33/04 |
| | | | | 257/13 |

FOREIGN PATENT DOCUMENTS

| | | | | |
|---|---|---|---|---|
| CN | 103855263 | | 6/2014 | |
| CN | 103855263 A | * | 6/2014 | |
| CN | 110265516 A | * | 9/2019 | |
| CN | 112510130 A | * | 3/2021 | |
| WO | WO-2008089739 A1 | * | 7/2008 | ............ H01L 33/02 |
| WO | WO-2013066088 A1 | * | 5/2013 | ............ H01L 33/42 |
| WO | WO-2018035324 A1 | * | 2/2018 | ....... H01L 21/02579 |

OTHER PUBLICATIONS

L. Esaki, "New Phenomenon in Narrow Germanium p-n Junctions". Physical Review 109, (1958), pp. 603-604.
J. Simon et al., "Polarization-Induced Hole Doping in Wide-Band-Gap Uniaxial Semiconductor Heterostructures". Science, Jan. 1, 2010, vol. 327 (5961): pp. 60-64.
S. Krishnamoorthy et al., "InGaN/GaN tunnel junctions for hole injection in GaN light emitting diodes". Appl. Phys. Lett. 105, pp. 141104-1 to 141104-4 (2014).
S. Krishnamoorth et al., "GdN Nanoisland-Based GaN Tunnel Junctions". Nano Lett. 13, pp. 2570-2575 (2013).
A Plobil et al., "Wafer direct bonding: Tailoring adhesion between brittle materials," Mater. Sci. Eng. R Reports, vol. 25, No. 1, pp. 1-88, 1999.
E. C. Young et al., "Hybrid tunnel junction contacts to III-nitride light-emitting diodes," Appl. Phys. Express, vol. 9, No. 2, pp. 022102 1 to 022102 4, Feb. 2016.
S. Krishnamoorthy et al., "Low resistance GaN/InGaN/GaN tunnel junctions," Appl. Phys. Lett., vol. 102, No. 11, pp. 113503-1 to 113503-5, 2013.
PCT International Search Report & Written Opinion dated Apr. 21, 2017 for PCT Application No. PCT/US2017/016720.

* cited by examiner

III-NITRIDE LIGHT EMITTING DIODES WITH TUNNEL JUNCTIONS WAFER BONDED TO A CONDUCTIVE OXIDE AND HAVING OPTICALLY PUMPED LAYERS

CROSS REFERENCE TO RELATED APPLICATIONS

This application claims the benefit under 35 U.S.C Section 119(e) of the following and commonly-assigned application:

U.S. Provisional Application Ser. No. 62/292,015, filed on Feb. 5, 2016, by James S. Speck, Asad Mughal, Erin C. Young, and Steven P. DenBaars, entitled "LIGHT EMITTING DIODE WITH A TUNNEL JUNCTION CONTACT WAFER BONDED TO A CONDUCTIVE OXIDE,"; and U.S. Provisional Application Ser. No. 62/298,268, filed on Feb. 22, 2016, by Stacy J. Kowsz, Robert M. Farrell, Benjamin Yonkee, Erin C. Young, Christopher D. Pynn, Tal Margalith, Shuji Nakamura, and Steven P. DenBaars, entitled "TUNNEL JUNCTION DEVICES WITH MONOLITHIC OPTICALLY-PUMPED AND ELECTRICALLY-INJECTED III-NITRIDE LAYERS,";

both of which applications are incorporated by reference herein.

This application is related to the following co-pending and commonly-assigned U.S. patent applications:

U.S. Utility application Ser. No. 15/107,812, filed on Jun. 23, 2016, by Robert M. Farrell, Shuji Nakamura, and Claude C. A. Weisbuch, entitled "MONOLITHIC INTEGRATION OF OPTICALLY PUMPED AND ELECTRICALLY INJECTED III-NITRIDE LIGHT-EMITTING DEVICES,", which application claims the benefit under 35 U.S.C Section 365(c) of co-pending and commonly-assigned P.C.T. International Patent Application No. PCT/US2014/072752, filed on Feb. 18, 2015, by Robert M. Farrell, Shuji Nakamura, and Claude C. A. Weisbuch, entitled "MONOLITHIC INTEGRATION OF OPTICALLY PUMPED AND ELECTRICALLY INJECTED III-NITRIDE LIGHT-EMITTING DEVICES,", which application claims the benefit under 35 U.S.C Section 119(e) of commonly-assigned U.S. Provisional Application Ser. No. 61/921,829, filed on Dec. 30, 2013, by Robert M. Farrell, Shuji Nakamura, and Claude C. A. Weisbuch, entitled "MONOLITHIC INTEGRATION OF OPTICALLY PUMPED AND ELECTRICALLY INJECTED III-NITRIDE LIGHT-EMITTING DEVICES,";

P.C.T. International Patent Application No. PCT/US2016/041744, filed on Jul. 11, 2016, by Erin C. Young, Benjamin P. Yonkee, John T. Leonard, Tal Margalith, James S. Speck, Steven P. DenBaars, and Shuji Nakamura, entitled "HYBRID GROWTH METHOD FOR III-NITRIDE TUNNEL JUNCTION DEVICES,", which application claims the benefit under 35 U.S.C Section 119(e) of commonly-assigned U.S. Provisional Patent Application No. 62/190,929, filed on Jul. 10, 2015, by Erin C. Young, Benjamin P. Yonkee, John T. Leonard, Tal Margalith, James S. Speck, Steven P. DenBaars, and Shuji Nakamura, entitled "HYBRID GROWTH METHOD FOR III-NITRIDE TUNNEL JUNCTION DEVICES,"; and P.C.T. International Application Serial No. PCT/US16/59929, filed on Nov. 1, 2016, by Benjamin P. Yonkee, Erin C. Young, John T. Leonard, Tal Margalith, James S. Speck, Steven P. DenBaars, and Shuji Nakamura, entitled "III-NITRIDE TUNNEL JUNCTION WITH MODIFIED P-N INTERFACE", which application claims the benefit under 35 U.S.C. Section 119(e) of U.S. Provisional Patent Application No. 62/250,758, filed on Nov. 4, 2015, by Benjamin P. Yonkee, Erin C. Young, John T. Leonard, Tal Margalith, James S. Speck, Steven P. DenBaars, and Shuji Nakamura, entitled "III-NITRIDE TUNNEL JUNCTION WITH MODIFIED P-N INTERFACE,";

all of which applications are incorporated by reference herein.

BACKGROUND OF THE INVENTION

1. Field of the Invention

This invention relates to III-nitride light emitting diodes (LEDs) with tunnel junctions wafer bonded to a conductive oxide and having optically-pumped layers.

2. Description of the Related Art (Note: This application references a number of different publications as indicated throughout the specification by one or more reference numbers in brackets, e.g., [x]. A list of these different publications according to these reference numbers can be found below in the section entitled "References." Each of these publications is incorporated by reference herein.)

A number of techniques have been used for improving the performance of III-nitride optoelectronic devices. The term "III-nitride" refers to any alloy composition of the (Al,Ga,In,B)N semiconductors having the formula $Al_wGa_xIn_yB_zN$, where $$0 \le w \le 1, 0 \le x \le 1, 0 \le y \le 1, 0 \le z \le 1, \text{ and } w+x+y+z=1.$$

Current commercially-available III-nitride optoelectronic devices, such as light-emitting diodes (LEDs), laser diodes (LDs), edge emitting laser diodes (EELDs), and vertical cavity surface emitting lasers (VCSELs), use an active region in a biased p-n junction to allow for electron and hole injection. However, p-type gallium nitride (p-GaN) is difficult to contact electrically, and has low hole concentration and mobility. This means that p-GaN cannot be used as a current spreading layer and that traditional p-contacts will add significant voltage to devices. Despite these inherent problems, all commercially-available III-nitride optoelectronic devices utilize a p-contact and a material other than p-GaN for current spreading, typically transparent conducting oxides (TCO).

Recently, tunnel junctions (TJs) have been proposed to address these issues. A tunnel junction (TJ) is a highly doped $(n^+/p^+)$ interface that allows electrons to tunnel between the valence band and conduction band. When a tunnel junction is used as the top layers of a standard p-type-up III-nitride LED heterostructure, and the LED is operated under standard forward bias conditions, the tunnel junction is under reverse bias and results in hole injection in the p-side of the LED. This allows normal operation of the LED, but with an n-type contact on both sides of the device, rather than using a traditional p-type contact. The tunnel junction also allows for current spreading in n-GaN on both sides of the device.

Nonetheless, there is a need in the art for structures for improving the performance of III-nitride optoelectronic devices with tunnel junctions. The present invention satisfies this need.

SUMMARY OF THE INVENTION

To overcome the limitations in the prior art described above, and to overcome other limitations that will become apparent upon reading and understanding this specification, the present invention discloses a III-nitride optoelectronic device including at least one n-type layer, an active region grown on or above the n-type layer, at least one p-type layer grown on or above the active region, and a tunnel junction grown on or above the p-type layer. An optional n-type current spreading layer may be grown on or above the tunnel junction.

A conductive oxide is wafer bonded on or above the tunnel junction, wherein the conductive oxide comprises a transparent conductor and may contain light extraction features on its non-bonded face. If the optional n-type current spreading layer is grown on or above the tunnel junction, then the conductive oxide is wafer bonded on or above the optional n-type current spreading layer.

The tunnel junction also enables monolithic incorporation of electrically-injected and optically-pumped III-nitride layers, wherein the optically-pumped III-nitride layers comprise high-indium-content III-nitride layers formed as quantum wells (QWs) that are grown on or above the tunnel junction or the optional n-type current spreading layer. The optically-pumped high-indium-content III-nitride layers emit light at a longer wavelength than the electrically-injected III-nitride layers.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to a specific embodiment in which the invention may be practiced. It is to be understood that other embodiments may be utilized and structural changes may be made without departing from the scope of the present invention.

Overview

Tunnel junctions are used in a variety of technological applications. Since their first demonstration by Esaki in highly doped Germanium (Ge) homojunctions [1] with very thin depletion regions, tunnel junctions have been featured in devices such as transistors and multi junction photovoltaics.

A low resistance tunnel junction also expands the design space of III-nitride LEDs, LDs, EELDs, VCSELs, and other optoelectronic devices. A tunnel junction incorporated into these optoelectronic devices allows the epitaxial structure of the device to use n-GaN on both sides of the p-n interface. This can be used to eliminate p-contacts and replace them with lower resistance n-contacts. In addition, n-GaN can be used as an effective current spreading layer.

There have been a number of difficulties in achieving high quality tunnel junctions in the GaN system. GaN is a wide bandgap semiconductor, so the barrier for tunneling is high. Several approaches to reducing the tunneling barrier have been attempted, including bandgap engineering via polarization using aluminum nitride (AlN) interlayers [2], reducing the bandgap with an indium gallium nitride (InGaN) interlayer [3], and introducing defect states via interfacial gadolinium nitride (GdN) nanoparticles [4]. However, all of these approaches are associated with losses, either in terms of voltage or resistance increases or optical losses in the final device performance.

In principle, a highly-doped Esaki-type homojunction diode should provide the lowest-loss tunnel junction. However, magnesium (Mg) doped p-GaN grown by MOCVD is compensated by hydrogen (H) as grown, and it must be annealed after growth to remove hydrogen. This anneal can only work if the p-GaN is not covered by n-GaN, as hydrogen cannot easily diffuse through n-GaN. This limits the effectiveness of tunnel junctions and prevents their widespread use in GaN.

Unlike MOCVD grown p-GaN, MBE grown p-GaN is conductive as grown, which allows for its use in a tunnel junction. Additionally, the doping limits of MBE grown p-GaN are higher, which allows for better tunnel junctions.

In previous applications, which are cross-referenced above, it was shown that combining MOCVD grown light emitters and MBE grown tunnel junctions could reduce the operating voltage devices and increase the efficiency. The structure of such devices is described below.

Figure 1:
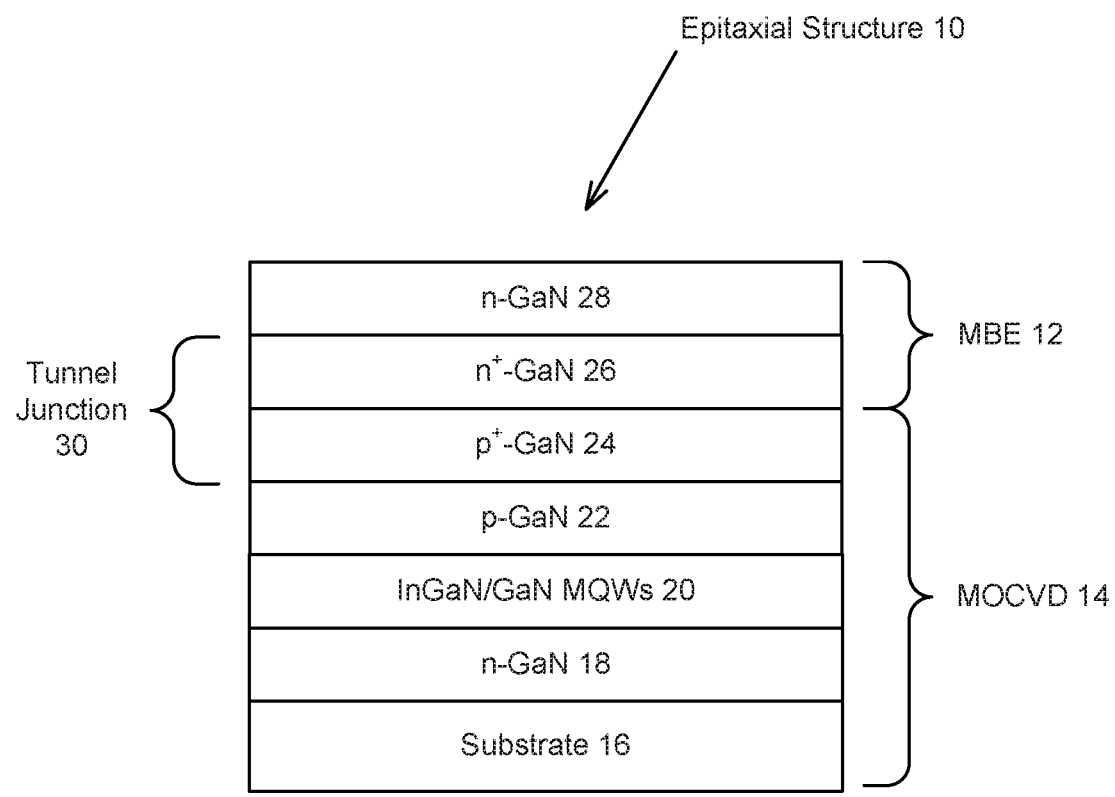
FIG. 1 is a cross-sectional schematic of an epitaxial structure for a tunnel junction grown by molecular beam epitaxy (MBE) on an LED grown by metal-organic chemical vapor deposition (MOCVD), according to one embodiment.

FIG. 1 is a cross-sectional schematic of an MBE tunnel junction grown on an MOCVD LED, according to one embodiment. The epitaxial structure 10 is annotated by the respective MBE 12 or MOCVD 14 growth technique to the right of the layers 16-28.

The MOCVD 14 growth is performed on a substrate 16, such as a bulk GaN substrate, and includes an n-GaN layer 18, an active region comprised of InGaN/GaN multi-quantum wells (MQWs), a p-GaN layer 22 and a highly-doped p$^+$-GaN layer 24. An ammonia MBE 12 regrowth is then performed, which includes a highly-doped n$^+$-GaN layer 26 followed by an optional n-GaN layer 28 for current spreading. The regrowth interface between the p$^+$-GaN layer 24 and the n$^+$-GaN layer 26 serves as a p-n interface in a tunnel junction 30.

Thereafter, a mesa etch is performed (not shown) to expose the bottom n-GaN layer 18. An n-contact (not shown) is then deposited on both the bottom and top n-GaN layers 18, 28.

The use of tunnel junctions provide a number of advances for III-nitride optoelectronic devices, as noted above. Nonetheless, there remains a need for improved and novel device designs using tunnel junctions in III-nitride optoelectronic devices.

III-Nitride Light Emitting Diodes with Tunnel Junctions Wafer Bonded to a Conductive Oxide Wafer bonding extends the design parameters of III-nitride optoelectronic devices by allowing for the formation of heterojunctions that are not possible through conventional deposition schemes. Wafer bonding to transparent conductive materials also allows for higher efficiency through enhanced light extraction.

For example, in conventional LEDs, flat interfaces and light absorbing materials limit efficiency by reducing the amount of light that can transmit from the active region out to air. Epitaxially-grown tunnel junctions can help mitigate this by providing n-GaN current spreading layers as an alternative to highly absorbing metal layers.

However, since n-GaN is typically deposited using techniques that have low growth rates, a hybrid structure would be required in order to achieve good current spreading. Transparent conductors, such as transparent conductive oxides, can be used for this purpose and may be deposited or joined using various techniques. These transparent conductive oxides may include, but are not limited to, impurity-doped $Ga_2O_3$, ZnO, $TiO_2$, or ITO ($SbO_2$:$In_2O_3$, which is typically 90 w % $In_2O_3$ and 10 wt % $SbO_2$).

Figure 2:
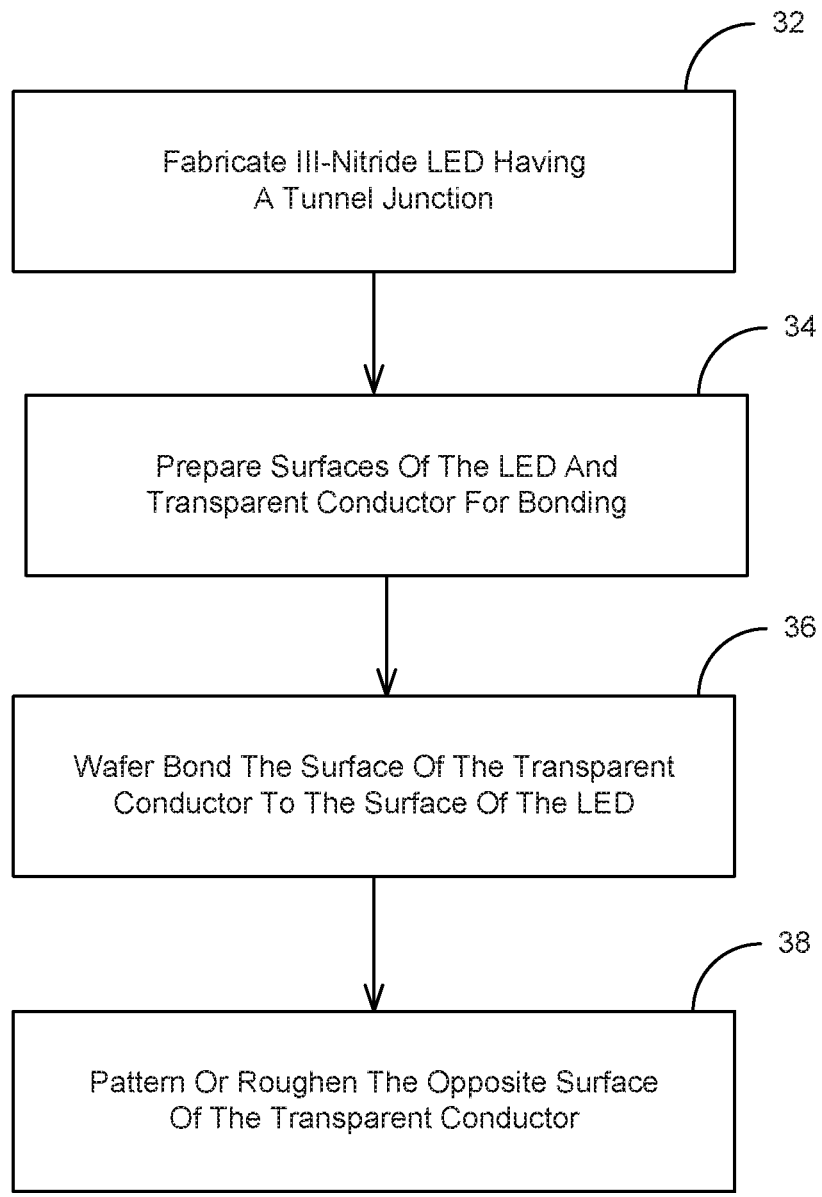
FIG. 2 is a flowchart illustrating a process flow for wafer-bonding a transparent conductor to a III-nitride LED with a tunnel junction, according to one embodiment.

FIG. 2 is a flowchart illustrating a process flow for wafer-bonding a transparent conductor to a III-nitride optoelectronic device with a tunnel junction, according to one embodiment. In this embodiment, an n-type transparent conductive oxide is wafer bonded on or above the tunnel junction of a III-nitride LED.

Block 32 represents the step of fabricating the III-nitride LED with the tunnel junction. Specifically, this step fabricates the LED shown in FIG. 1, and variants thereof.

Block 34 represents the step of preparing surfaces of the LED and transparent conductor for bonding. In order to form a good bond between a transparent conductive oxide and the LED, the surfaces must be treated such that they are free of any contaminants which may impede the bonding process. This may done, for example, through extensive solvent cleaning, surface descum, and surface activation using oxygen plasmas.

Block 36 represents the step of wafer-bonding the surface of the transparent conductor to the surface of the LED. The two surfaces are made to contact one another under elevated pressures and temperatures, resulting in the wafer bond. After this process, the two surfaces are both chemically and mechanically joined at the interface.

Block 38 represents the step of patterning or roughening the non-bonded face of the transparent conductor opposite the LED. Surface roughening or patterning is employed in order to improve light extraction from the device, by allowing for increased out-coupling of light from the active region of the LED.

Figure 3:
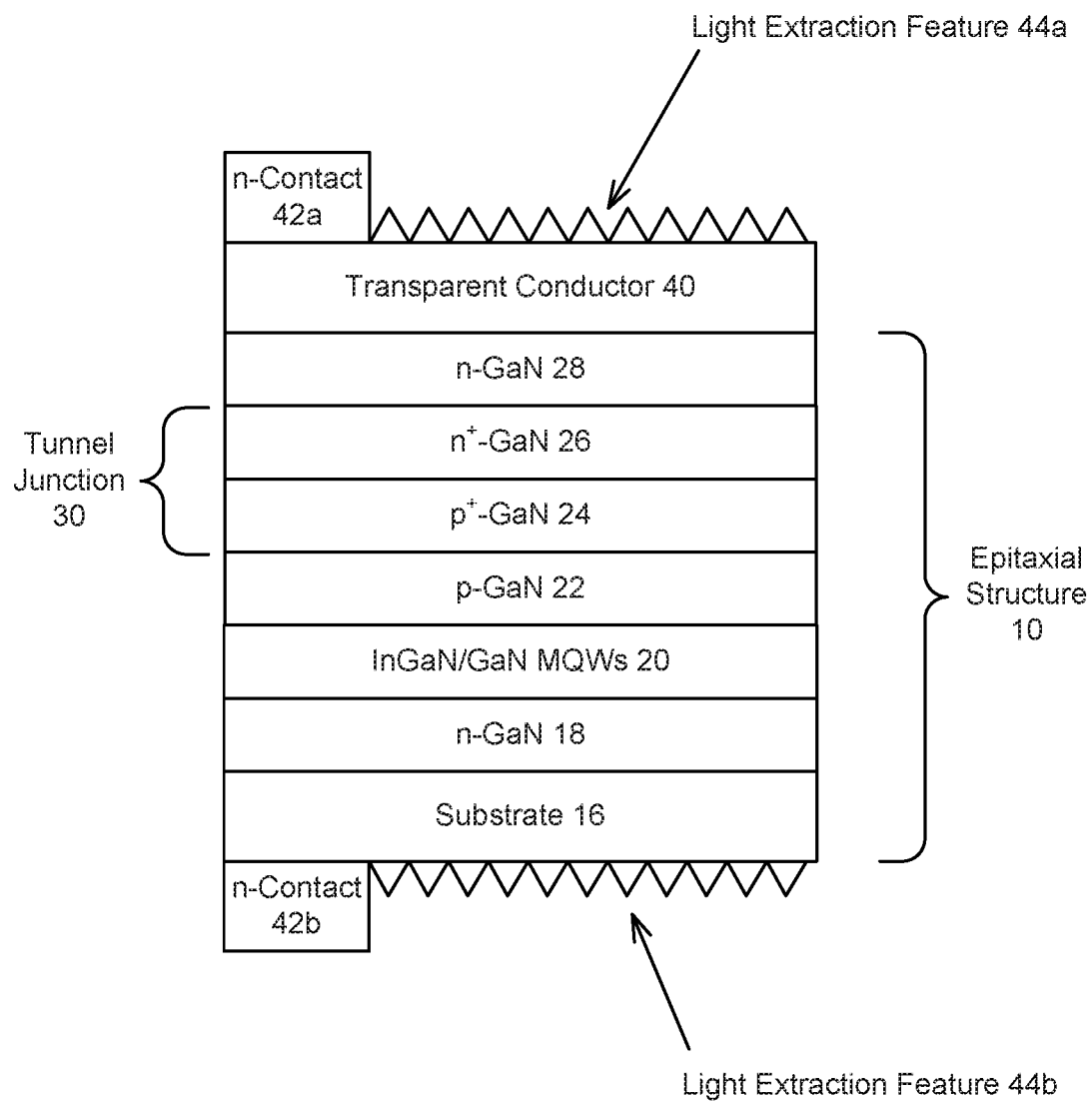
FIG. 3 is a cross-sectional schematic of the III-nitride LED with the tunnel junction shown in FIG. 1 that has been wafer bonded to a transparent conductor using the method of FIG. 2.

FIG. 3 is a cross-sectional schematic of the III-nitride LED with the tunnel junction shown in FIG. 1, that has been wafer bonded to a transparent conductor using the method of FIG. 2. In one embodiment, a bulk transparent conductor 40 (i.e., an n-type transparent conductive oxide such as n-$Ga_2O_3$) is wafer-bonded on or above the n-GaN current spreading layer 28. In another embodiment, n-GaN layer 28 may be omitted and the transparent conductor 40 is wafer-bonded on or above the n+-GaN layer 26 of the tunnel junction 30. Thereafter, n-contacts 42a, 42b are made to both the transparent conductor 40 and the substrate 16. In addition, both the substrate 16 and transparent conductor 40 may be patterned or roughened to create light extraction features 44a, 44b, i.e., on the bottom of the substrate 16 and on the non-bonded face of the transparent conductor 40.

In another embodiment, the transparent conductor 40 may have a graded doping profile including highly-doped n-type transparent conductive oxide (e.g., n+$Ga_2O_3$). Moreover, the proposed layer order may be altered to the following (where left-to-right represents bottom-to-top):

pGaN|p+GaN|n+GaN|nGaN|n+GaN|n+$Ga_2O_3$|n$Ga_2O_3$ or:

pGaN|p+GaN|n+GaN|n+$Ga_2O_3$|n$Ga_2O_3$

In still other embodiments, the conductive oxide may be wafer-bonded to the p-side of the III-nitride LED. For example, it is possible to directly wafer-bond the transparent conductor 40 on or above the p+-GaN layer 24.

In yet another embodiment, the tunnel junction can act as a contact layer and the conductive oxide can act as a current spreading layer. For example, the tunnel junction 30 can act as a p-contact and the transparent conductor 40 can act as a current spreading layer.

III-Nitride Light Emitting Diodes with Tunnel Junctions having Monolithic Optically-Pumped And Electrically-Injected III-Nitride Layers Use of tunnel junctions as described above also allows for the use of optically-pumped III-nitride QWs for longer wavelength emission in an electrically-injected III-nitride optoelectronic device with shorter wavelength emission. Specifically, the use of tunnel junctions enables low temperature growth of the optically-pumped InGaN/GaN QWs with higher indium content, which may be damaged by high temperature growth of the electrically-injected III-nitride optoelectronic device. However, to achieve these high-indium-content III-nitride QWs, it is typically necessary to grow on nonpolar and/or semipolar planes of the III-nitride to eliminate polarization effects.

Current state-of-the-art III-nitride thin films, heterostructures, and devices are grown along the [0001] c-axis in a polar (c-plane) direction. The total polarization of such films consists of spontaneous and piezoelectric polarization contributions, both of which originate from the single polar [0001] c-axis of the wurtzite III-nitride crystal structure. When III-nitride heterostructures are grown pseudomorphically, polarization discontinuities are formed at surfaces and interfaces within the crystal. These discontinuities lead to the accumulation or depletion of carriers at surfaces and interfaces, which in turn produces electric fields. Since the alignment of these polarization-induced electric fields coincides with the typical [0001] growth direction of III-nitride thin films and heterostructures, these fields have the effect of "tilting" the energy bands of III-nitride devices.

In c-plane III-nitride QWs, the "tilted" energy bands spatially separate the electron and hole wavefunctions. This spatial charge separation reduces the oscillator strength of radiative transitions and red-shifts the emission wavelength. These effects are manifestations of the quantum confined Stark effect (QCSE) and have been thoroughly analyzed for c-plane III-nitride QWs. Additionally, the large polarization-induced electric fields can be partially screened by injected carriers, making the emission characteristics difficult to engineer accurately.

One approach to decreasing polarization effects in III-nitride devices is to grow the devices on nonpolar planes of the crystal. These include the {11-20} planes, known collectively as a-planes, and the {10-10} planes, known collectively as m-planes. In GaN, such planes contain equal numbers of gallium and nitrogen atoms per plane and are charge-neutral. Subsequent nonpolar layers are equivalent to one another, so the bulk crystal will not be polarized along the growth direction.

Another approach to reducing polarization effects in III-nitride devices is to grow the devices on semipolar planes of the crystal. The term "semipolar plane" can be used to refer to any plane that cannot be classified as c-plane, a-plane, or m-plane. In crystallographic terms, a semipolar plane would be any plane that has at least two nonzero h, i, or k Miller indices and a nonzero l Miller index. Subsequent semipolar layers are equivalent to one another, so the bulk crystal will have reduced polarization along the growth direction.

With reduced polarization-induced electric fields in nonpolar and semipolar devices, it is possible to achieve more efficient long wavelength emitting devices, due to an increase in the carrier wavefunction overlap. Reduced polarization-induced electric fields also result in improved efficiency of nonpolar and semipolar LEDs, as compared to c-plane LEDs when operated at high current densities.

An additional benefit of growing nonpolar and semipolar III-nitrides is that emission is optically polarized. For nonpolar and semipolar LEDs, light emitted normal to the surface is partially polarized due to anisotropic biaxial stress in InGaN QWs that increases the energy separation of the top two valence bands and changes the state character of the valence bands, whereas light emitted normal to the surface of a c-plane device is not polarized because the biaxial stress in a coherent c-plane QW is isotropic in the m- and a-directions.

Despite the inherent advantages of growing on nonpolar and semipolar planes, challenges still remain for realizing long wavelength emission, including green, yellow, amber, and red light. High-indium-content layers are necessary for long emission wavelengths, but high-indium-content layers are difficult to achieve.

Optically-pumping high-indium-content III-nitride layers for long wavelength emission offers several advantages over electrically-injected structures. In a structure utilizing optically-pumped high-indium-content III-nitride layers for long wavelength emission, a III-nitride LED or LD can be used as the excitation source. This III-nitride LED or LD needs to emit light at a shorter wavelength (e.g. in the blue or violet region of the spectrum), so that it is absorbed by the optically-pumped III-nitride layers (which may emit at longer wavelengths in the green, yellow, amber, and/or red region of the spectrum). It is possible to tune the emission of the optically-pumped and electrically-injected III-nitride layers to produce white light.

Optically-pumping III-nitride QWs, rather than electrically-injecting III-nitride QWs, has several advantages for realizing long wavelength emission from III-nitride QWs.

First, eliminating electrical-injection enables a structure that does not involve the high temperature growth steps after the growth high-indium-content III-nitride QWs, which is advantageous because high temperature growth steps can degrade high-indium-content layers. High growth temperature steps typically are required after QW growth for growth of electrically-injected p-type layers to ensure adequate p-type conduction.

Second, because optically-pumped III-nitride QWs do not have to be confined within a depletion width and do not require carrier transport between QWs, MQWs can be grown, and wide or strain-compensating barriers can be employed, to help prevent relaxation of high-indium content layers. Because this part of the structure is not electrically injected, the thick barriers will not contribute to higher voltages. Being able to design the barriers for stress management is particularly important for high-indium-content III-nitride layers, because increased lattice mismatch at the heterointerface reduces their critical thickness for the onset of stress-induced relaxation, and these relaxation mechanisms form defects at which non-radiative recombination occurs.

A third advantage of optically-pumping long wavelength emitting III-nitride QWs is that the doping profile can be engineered to optimize the emission wavelength. When a built-in electric field acts in the same direction as the piezoelectric polarization-induced electric field, the total electric field in the QW increases, thus decreasing the energy of the ground state transition and red-shifting emission. Therefore, doping can enable emission at longer wavelengths than can otherwise be achieved. Alternatively, doping can increase the emission wavelength of a QW, so that a desired emission wavelength can be realized using a lower-indium-content QW or a thinner QW. The ability to utilize lower-indium-content QWs for long wavelength emission is important because it is challenging to achieve growth of high-indium-content layers with high crystal quality. High-indium-content layers with high crystal quality are difficult to achieve because stress due to lattice mismatch activates relaxation mechanisms that result in defects. The crystal quality of high-indium-content layers is also negatively impacted by the low growth temperatures that are necessary to increase indium incorporation. Low growth temperatures result in decreased adatom diffusion, which can lead to growth errors, breakdown of surface morphology, and higher carbon impurity levels. The ability to utilize thinner QWs for long wavelength emission is important because high-indium-content QWs have increased lattice mismatch at the heterointerface, resulting in a reduced critical thickness for the onset of stress-induced relaxation, which results in the formation of non-radiative extended defects or three-dimensional (3D) growth.

A fourth benefit of optical-pumping III-nitride layers is that it can simplify the incorporation of light-emitting structures with two-dimensional (2D) confinement, including nano-pillars, nano-rods, or nano-wires. Electrical-injection of these structures with 2D confinement often involves growth and fabrication challenges, but these geometries offer multiple advantages for achieving high-indium-content III-nitrides, including reduced compositional pulling effects and ability to grow relaxed layers without defect formation.

Similarly, optical-pumping can simplify fabrication of devices incorporating high-indium-content III-nitride layers grown by limited-area-epitaxy (LAE). LAE feature sizes are larger than those offering 2D confinement, but offer opportunities to achieve coherently strained high-indium-content III-nitride layers with thicknesses above the critical thickness for relaxation observed for planar structures.

One of the challenges in achieving monolithically incorporated optically-pumped and electrically-injected III-nitride devices is that, to prevent thermal damage to the optically-pumped high-indium-content layers, the electrically-injected device with shorter wavelength emission must be grown first. The electrically-injected device will require higher growth temperatures. Higher growth temperatures are required for both the active region with high crystal quality lower-indium-content III-nitride layers, as well as the electrically-injected p-type layers. It is problematic to grow the optically-pumped III-nitride QWs after the growth of the electrically-injected device because p-type III-nitride layers typically must be exposed at the surface. It is necessary to have the p-type III-nitride layers exposed at the surface, so that device designs can incorporate transparent conducting contacts for current spreading across device areas. The p-type III-nitride layers are too resistive to result in appreciable current spreading.

Growth by MOCVD of InGaN is well known to have higher radiative recombination rates as compared to material grown by MBE. It is particular important to have p-type III-nitride layers grown by MOCVD exposed at the surface, because as-grown Mg-doped III-nitride layers are passivated due to the formation of a Mg—H complex. The p-type III-nitride material should be exposed at the surface in order to allow activation of the acceptors by annealing to remove hydrogen from the Mg—H complex. Activating buried p-type III-nitride layers is difficult, because H has low diffusivity in n-type layers.

Previous work cross-referenced above explored growing the electrically-injected device on one side of a double-side-polished substrate and subsequently growing the optically-pumped III-nitride QWs on the opposite side of the substrate. However, this process was complicated, because both sides of the substrate had to be prepared for epitaxy growth. The surface of the substrate used for growth of the optically-pumped III-nitride layers could not be damaged during the growth of the electrically-injected device. And, the p-type layers of the electrically-injected device had to be protected during the subsequent growth of the optically-pumped layers. Because substrates are typically hundreds of microns thick, the final double-sided device had the optically-pumped and electrically-injected QWs hundreds of microns away from each other. This large distance between the optically-pumped and electrically-injected was not desirable, as a large amount of light emitted by the electrically-injected device could escape through the sidewalls without the possibility of being absorbed by the optically-pumped QWs.

Use of a tunnel junction enables the growth of optically-pumped III-nitride QWs for longer wavelength emission after the growth of an electrically-injected III-nitride device with shorter wavelength emission. This is advantageous because higher-indium-content III-nitride QWs for longer wavelength emission are grown at low temperature and may be damaged by high temperature growth steps, which are required in the growth of a blue LED. The tunnel junction enables this epitaxial device design, because n-type GaN grown above the tunnel junction can be used for current spreading, whereas the conductivity of p-type GaN is too low to enable current spreading across device areas. The tunnel junction also enables the electrically-injected and optically-pumped QWs to be located in close spatial proximity, which is favorable for increasing the amount of light absorbed by the optically-pumped QWs.

Overall, an optically-pumped and electrically-injected III-nitride device with a tunnel junction is a simpler alternative as compared to a double-sided optically-pumped and electrically-injected III-nitride device. The optically-pumped and electrically-injected III-nitride device with the tunnel junction grows both the electrically-injected and optically-pumped QWs on the same face of the substrate and with the optically-pumped and electrically-injected QWs in close spatial proximity. With improved MOCVD tunnel junctions, the optically-pumped and electrically-injected III-nitride device with the tunnel junction can be grown in one continuous growth.

Thus, the present invention discloses a semiconductor device that combines the advantages of growing on semipolar III-nitride planes, optically-pumping high-indium-content III-nitride layers for long wavelength emission, and using a tunnel junction to monolithically incorporate electrically-injected III-nitride QWs that are used to excite optically-pumped III-nitride QWs. By optimizing the emission, this device can produce white light and thus is an alternative to white light created by using blue or violet emitting III-nitride LEDs or LDs to pump powdered phosphors that emit yellow or red wavelengths. White light created by semipolar III-nitride QWs with varying bandgaps offers the benefit that the emitted light is partially polarized, compared to the unpolarized emission that results from powdered phosphors and scattered light. This is of significant interest because polarized light has unique applications, for example in backlit liquid-crystal displays.

Figure 4:
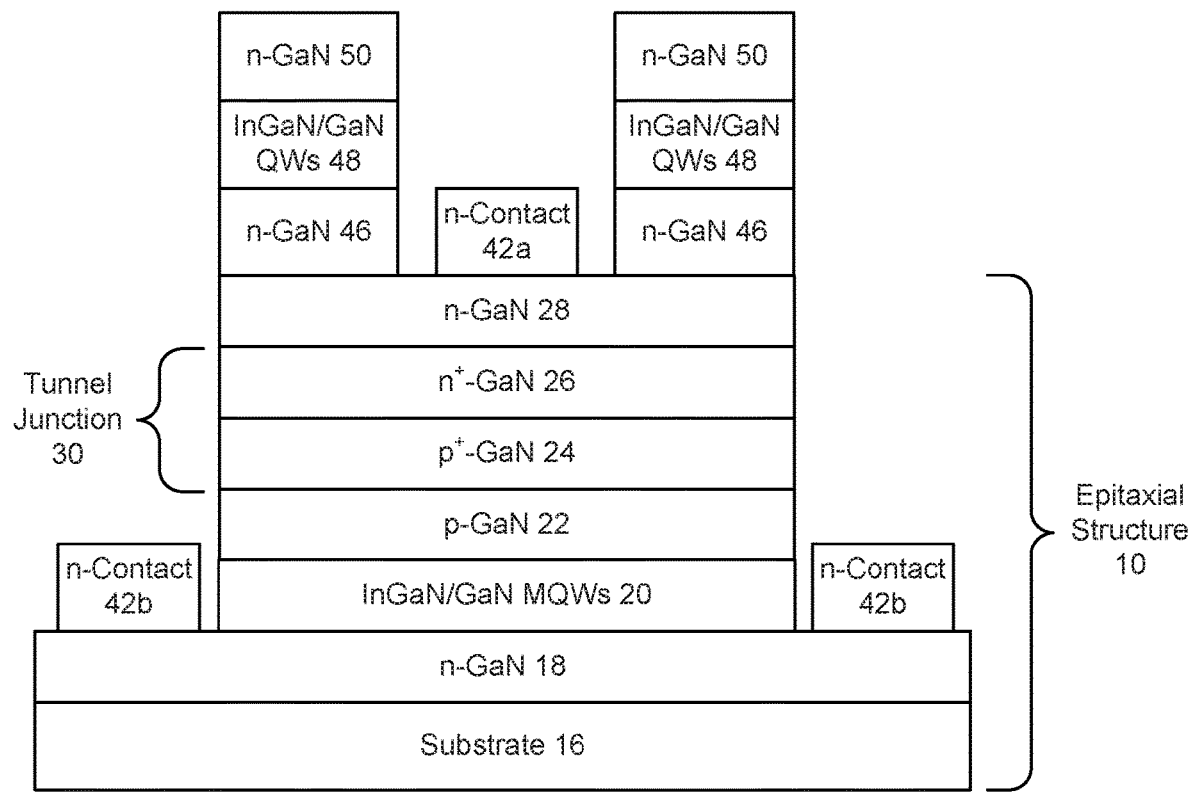
FIG. 4 is a cross-sectional schematic of the epitaxial structure shown in FIG. 1 that has been modified to include optically-pumped high-indium-content III-nitride layers, according to one embodiment.
Figure 5:
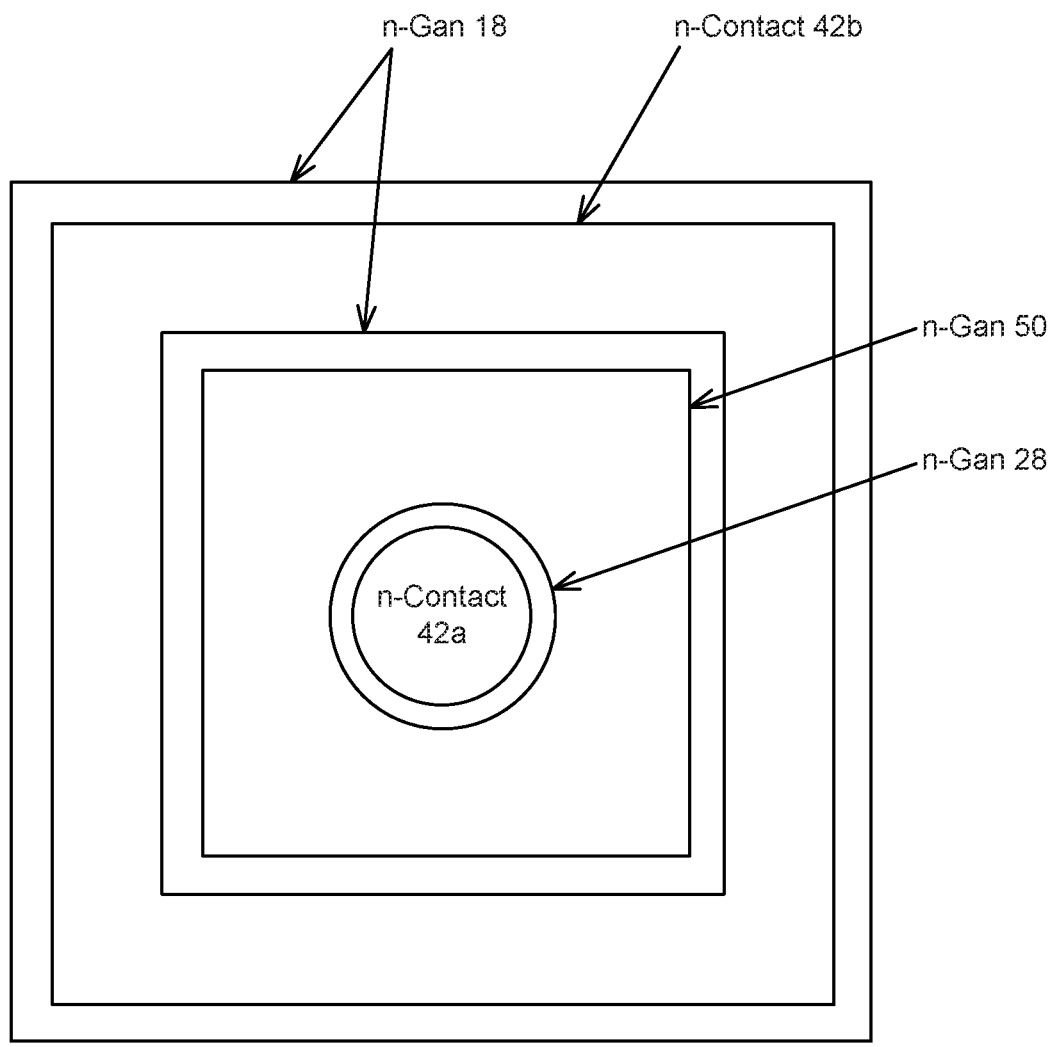
FIG. 5 is a top plan-view schematic of the device of FIG. 4, wherein various elements are shown.

FIGS. 4 and 5 are cross-sectional and plan view schematics of one embodiment, respectively, which describe a design where optically-pumped III-nitride layers 46, 48, 50 are grown after electrically-injected III-nitride layers 18-28, utilizing the tunnel junction 30 to make contact to the electrically-injected III-nitride layers 18-28.

Specifically, FIG. 4 is a cross-sectional schematic of the epitaxial structure 10 shown in FIG. 1 that has been modified to include n-GaN layer 46, optically-pumped high-indium-content III-nitride QWs 48, and n-GaN layer 50 grown on or above the tunnel junction 30, wherein the layers 46, 48, 50 may be repeated as desired. This structure allows the growth of the optically-pumped III-nitride QWs 48 to occur subsequent to the higher temperature growth steps of the electrically-injected III-nitride layers 18-28, thus protecting the optically-pumped high-indium-content III-nitride QWs 48 from thermal damage.

In FIG. 4, the epitaxial structure 10 is a blue or violet emitting III-nitride LED grown on or above a double-side-polished semipolar (20-21) GaN substrate 16, wherein the LED has an active region comprised of electrically-injected blue or violet emitting InGaN/GaN MQWs 20. The n-GaN 28 grown on or above the tunnel junction 30 ensures adequate lateral current spreading across the device. In one embodiment, the n-GaN 44, the optically-pumped high-indium-content III-nitride QWs 46 and the n-GaN layer 48, are grown on or above this current spreading n-GaN 28. In another embodiment, the n-GaN 28 is omitted, and the n-GaN 44, the optically-pumped high-indium-content III-nitride QWs 46 and the n-GaN layer 48, are grown on or above the tunnel junction 30. Thereafter, the layers 20-28 and 46-50 are etched, and n-contacts 42b are deposited on the n-GaN 18 above the substrate 16 (with the layers 20-28 and 46-50 exposed by a mesa etch) and an n-contact 42a is deposited on the n-GaN 28 above the tunnel junction 30 (with the n-GaN 28 exposed by a mesa etch), but at least some of the surface of growth for the n-GaN 46, the optically-pumped III-nitride QWs 48, and the n-GaN 50, remains unetched.

FIG. 5 is a top plan-view schematic of the device of FIG. 4, wherein various elements are shown, including the n-contact 42b to the n-GaN 18 of the LED, the n-GaN 18 of the LED exposed by the mesa etch, the n-contact 42a to the n-GaN 28, the n-GaN 28 exposed by the mesa etch, and the surface of the unetched n-GaN 50 above the optically-pumped III-nitride QWs 48.

A wide variety of possibilities exist for designing the optically-pumped III-nitride QWs 48, but in one embodiment, the optically-pumped high-indium-content III-nitride QWs 48 are multi-QWs 48 grown in order of increasing wavelength emission, wherein the growth temperature(s) of the earlier-deposited longer wavelength QWs 48 are lower than the growth temperature(s) of the later-deposited shorter wavelength QWs 48. Thus, growing the optically-pumped high-indium-content III-nitride QWs 48 in order of increasing wavelength minimizes the thermal damage to high-indium-content III-nitride layers 48, by minimizing the high temperature growth after each QW 48. If the optically-pumped high-indium-content III-nitride layers 48 are grown in order of decreasing wavelength emission, each QW 48 would be damaged by following higher temperature QW 48 growth. Also, the emission intensity of longer wavelength high-indium-content III-nitride layers 48 is weaker. Thus, growing the optically-pumped high-indium-content III-nitride layers 48 in order of increasing wavelength increases the emission intensity of the longer wavelength emissions by reabsorption of the shorter wavelength emissions.

After growth, the p-type III-nitride layers 22, 24 are activated by thermal annealing to remove hydrogen from the acceptor-hydrogen complex. This step will likely occur after the formation of a mesa, which will etch down to expose an area to contact the n-GaN 18 of LED and will expose the p-type III-nitride layers 22, 24 at the sidewalls of the device. An additional etch will also be required to expose an area to contact the n-type III-nitride current spreading layer 28 above the tunnel junction 30. A reflective mirror (not shown) may be used on the back side of the substrate 16 to direct the shorter wavelength light towards the optically-pumped high-indium-content III-nitride QWs 48. In order to maintain the optical polarization of the emission, no roughening is employed in this embodiment.

Also, this example cites the semipolar (20-21) growth plane for the substrate 16 because previous results have indicated that it is a promising growth plane for III-nitride QWs 48 with long wavelength emission. However, this concept is also relevant for all semipolar and nonpolar planes of III-nitride layers. It may also be applied to growth of polar (c-plane) growth of III-nitrides, with optically polarized emission resulting from c-plane only if layers can be strained anisotropically.

The example discussed is concerned with white light emission by combining a blue or violet emitting III-nitride LED with optically-pumped green, yellow, orange, or red emitting QWs 48, but this concept is also relevant for any emission color.

The example discussed uses an electrically-injected III-nitride LED to optically-pump high-indium-content III-nitride layers, but this concept could also use an electrically-injected LD in place of the LED.

The example discussed a device with planar optically-pumped III-nitride QWs 48. However, there are many other possibilities for the optically-pumped III-nitride layers, including LAE patterns or geometries that offer 2D confinement, including nano-pillars, nano-rods, or nano-wires.

The example discussed indicates that the optically-pumped high-indium-content III-nitride layers are ordered such that layers closer to the extraction surface emit longer wavelengths. This order minimizes thermal damage to the high-indium-content III-nitride layers. This order also increases the emission intensity of the top higher-indium-content III-nitride layers by reabsorption of the light produced by the optically-pumped III-nitride layers lying beneath them. However, a device design with optically-pumped III-nitride layers stacked in any wavelength order may also be used.

The example discussed has the optically-pumped III-nitride QWs 48 situated in an n-i-n structure. However, situating the optically-pumped III-nitride QWs 48 in a p-i-n structure can be advantageous in achieving long wavelength emission. Thus, epitaxial designs that alter the doping in the optically-pumped III-nitride QWs 48, barriers between the optically-pumped III-nitride QWs 48, and layers adjacent to the optically-pumped III-nitride QWs 48 may be used. This may include, but is not limited to, situating the optically-pumped III-nitride QWs 48 within a p-i-n junction or multiple p-i-n junctions.

The example discussed has a final device with smooth top and bottom surfaces in order to preserve the polarization of the light emitted by the III-nitride QWs. A device design that employs a photonic crystal to improve extraction while maintaining optical polarization may also be used. A device design that incorporates a dichroic mirror for extraction engineering may be used. And, although roughening the surfaces would lead to scattering and be detrimental to the polarization ratio, a device design with roughened surfaces may also be used.

The example discussed here is a square device with a contact surrounding the device mesa to make contact to the n-side of the LED and a small circular contact to make contact to the n-side of the tunnel junction. However, a device design with any shape and geometry for the contacts may be used. It is also possible to create a vertical device where the n-side of the LED is contacted with a backside contact.

The example discussed uses a mesa to define the device area over which current is spread. It is also possible in a vertical device for the final size of the singulated chip to define the area over which current is spread.

The scope of this invention covers III-nitride LEDs, LDs, and absorbing layers with various designs, including varying number of quantum wells, quantum well thicknesses, quantum well alloy compositions, barrier thicknesses, and barrier alloy compositions.

Additional impurities or dopants can also be incorporated into the semipolar III-nitride thin films described in this invention. For example, Fe, Mg, Si, and Zn are frequently added to various layers in III-nitride heterostructures to alter the conduction properties of those and adjacent layers. The use of such dopants and others not listed here are within the scope of the invention.

Moreover, substrates other than semipolar GaN could be used for III-nitride thin film growth. The scope of this invention includes the growth of semipolar III-nitride thin films on all possible crystallographic orientations of all possible foreign substrates. These foreign substrates include, but are not limited to, sapphire, silicon carbide, silicon, zinc oxide, boron nitride, lithium aluminate, lithium niobate, germanium, aluminum nitride, lithium gallate, partially substituted spinels, and quaternary tetragonal oxides sharing the $\gamma$-LiAlO$_2$ structure.

Furthermore, variations in semipolar III-nitride nucleation (or buffer) layers and nucleation layer growth methods are compatible with this invention. The growth temperature, growth pressure, orientation, and composition of the nucleation layers need not match the growth temperature, growth pressure, orientation, and composition of the subsequent semipolar thin films and heterostructures. The scope of this invention includes the growth of semipolar III-nitride thin films on all possible substrates using all possible nucleation layers and nucleation layer growth methods.

As noted above, optically-pumping high-indium-content III-nitride layers allows for a device that is designed such that no high temperature growth steps occur after the growth of the high-indium-content III-nitride layers, which prevents thermal damage to the high-indium-content III-nitride layers. Optically-pumping high-indium-content III-nitride layers also allows for structures with wide or strain-compensating barriers for stress engineering to enable the growth MQW stacks. Optically-pumping III-nitride layers with long wavelength emission also allows for structures that utilize doping as a tool to engineer the emission wavelength, which enables longer wavelength emission or use of lower-indium-content III-nitride layers or thinner QWs for long wavelength emission. Optical-pumping III-nitride layers with long wavelength emission may also simplify incorporation of light-emitting structures with 2D confinement, including nano-pillars, nano-rods, or nano-wires.

Use of a tunnel junction enables the growth of optically-pumped III-nitride QWs for long wavelength emission after the growth of an electrically-injected III-nitride device with shorter wavelength emission. This growth sequence prevents the high-indium-content III-nitride QWs from being exposed to high growth temperatures, which can degrade high-indium-content III-nitride layers. Previous work explored growing the electrically-injected device on one side of a double-side-polished substrate and subsequently growing the optically-pumped QWs on the opposite side of the substrate. Use of a tunnel junction offers a simpler alternative, which grows both the electrically-injected and optically-pumped QWs one the same face of the substrate, possibly in one continuous growth sequence, and with the optically-pumped and electrically-injected QWs in close spatial proximity, which is advantageous for device performance.

Achieving a GaN-based yellow or red emitter would improve upon temperature-sensitive applications currently utilizing AlInGaP-based LEDs due to the improved thermal stability of the III-nitride material system. For example, some lighting applications currently use as AlInGaP red emitter to create warm white. Replacing the AlInGaP LED with an InGaN-based red LED could simplify driver designs, thus reducing overall system cost.

A device that uses an electrically-injected III-nitride LED to optically-pump high-indium-content III-nitride layers allows for the creation of white light, which has applications in solid-state lighting and displays. White light created by semipolar or nonpolar III-nitride QWs with varying bandgaps offers the benefit that the emitted light is optically polarized, compared to the unpolarized emission that results from c-plane emitters, powdered phosphors, and scattered light. This is of significant interest because polarized light has unique applications, for example in backlit liquid-crystal displays, 3D displays, or holograms.

The realization of semipolar III-nitride LEDs and LDs would allow for improved LED and LD device performance. With reduced polarization-induced electric fields in semipolar devices, it is possible to achieve more efficient long wavelength devices. Reduced polarization-induced electric fields also result in improved efficiency of semipolar LEDs compared to c-plane LEDs when operated at high current densities.

Lastly, this design makes use of vertically stacked III-nitride QWs emitting at different wavelengths and is an efficient use of substrate area, which is an important consideration for industry.

REFERENCES

The following publications and patent applications are incorporated by reference herein:

[1] L. Esaki, Physical Review 109, (1958).
[2] J. Simon et al. Science 327 (5961): 60-64.
[3] S. Krishnamoorthy et al, Appl. Phys. Lett. 105, 141104 (2014).
[4] S. Krishnamoorth et al, Nano Lett. 13, 2570-2575 (2013).
[5] A. Plößl and G. Kräuter, "Wafer direct bonding: Tailoring adhesion between brittle materials," Mater. Sci. Eng. R Reports, vol. 25, no. 1, pp. 1-88, 1999.
[6] E. C. Young, B. P. Yonkee, F. Wu, S. H. Oh, S. P. DenBaars, S. Nakamura, and J. S. Speck, "Hybrid tunnel junction contacts to III-nitride light-emitting diodes," Appl. Phys. Express, vol. 9, no. 2, p. 022102, February 2016.
[7] S. Krishnamoorthy, F. Akyol, P. S. Park, and S. Rajan, "Low resistance GaN/InGaN/GaN tunnel junctions," Appl. Phys. Lett., vol. 102, no. 11, 2013.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for fabricating a III-nitride optoelectronic device, comprising:
    wafer bonding a conductive oxide to one or more epitaxially-grown III-nitride layers, wherein:
    the III-nitride layers include at least one n-type layer, an active region grown on or above the n-type layer, and at least one p-type layer grown on or above the active region;
    the III-nitride layers include a tunnel junction grown on or above the p-type layer; and
    the conductive oxide is an impurity-doped n-type conductive oxide wafer bonded on or above a highly-doped n-type layer of the tunnel junction.

2. The method of claim 1, wherein at least one n-type current spreading layer is grown on or above the tunnel junction and the conductive oxide is wafer bonded on or above the n-type current spreading layer.

3. The method of claim 1, wherein the conductive oxide is a transparent conductor.

4. The method of claim 3, wherein the conductive oxide is $Ga_2O_3$.

5. The method of claim 3, wherein the conductive oxide is ZnO.

6. The method of claim 3, wherein the conductive oxide is $TiO_2$.

7. The method of claim 3, wherein the conductive oxide is ITO.

8. The method of claim 1, wherein the conductive oxide contains light extraction features on its non-bonded face.

9. The method of claim 1, wherein the tunnel junction acts as a p-contact.

10. The method of claim 1, wherein the conductive oxide acts as a current spreading layer.

11. The method of claim 1, wherein the conductive oxide acts as an n-contact.

12. The method of claim 1, wherein the impurity-doped n-type conductive oxide wafer has a graded doping profile.

13. The method of claim 1, wherein a highly-doped p-type layer of the tunnel junction is grown by metal organic chemical vapor deposition (MOCVD) and the highly-doped n-type layer of the tunnel junction is regrown by ammonia molecular beam epitaxy (MBE).

14. A III-nitride optoelectronic device, comprising:
a conductive oxide wafer bonded to one or more epitaxially-grown III-nitride layers, wherein:
the III-nitride layers include at least one n-type layer, an active region grown on or above the n-type layer, and at least one p-type layer grown on or above the active region;
the III-nitride layers include a tunnel junction grown on or above the p-type layer; and
the conductive oxide is an impurity-doped n-type conductive oxide wafer bonded on or above a highly-doped n-type layer of the tunnel junction.

* * * * *